US011210437B2

(12) United States Patent
Semaan et al.

(10) Patent No.: US 11,210,437 B2
(45) Date of Patent: Dec. 28, 2021

(54) SYSTEMS AND METHODS FOR TOWER ANTENNA MOUNT ANALYSIS AND DESIGN

(71) Applicant: Tower Engineering Solutions, LLC, Las Vegas, NV (US)

(72) Inventors: Robert Semaan, Aventura, FL (US); Hanming You, Irving, TX (US)

(73) Assignee: Tower Engineering Solutions, LLC, Las Vegas, NV (US)

( * ) Notice: Subject to any disclaimer, the term of this patent is extended or adjusted under 35 U.S.C. 154(b) by 566 days.

(21) Appl. No.: 15/951,835

(22) Filed: Apr. 12, 2018

(65) Prior Publication Data

US 2018/0300439 A1 Oct. 18, 2018

Related U.S. Application Data

(60) Provisional application No. 62/484,752, filed on Apr. 12, 2017.

(51) Int. Cl.
*G06F 30/20* (2020.01)
*G06F 3/048* (2013.01)
(Continued)

(52) U.S. Cl.
CPC .............. *G06F 30/20* (2020.01); *G06F 3/048* (2013.01); *H01Q 1/246* (2013.01); *H01Q 21/0087* (2013.01); *G06F 30/13* (2020.01)

(58) Field of Classification Search
CPC ......... G06F 30/20; G06F 3/048; H01Q 1/246; H01Q 21/0087
(Continued)

(56) References Cited

U.S. PATENT DOCUMENTS 4,249,182 A * 2/1981 Rupley ................ H01Q 1/1235
248/539
5,276,454 A * 1/1994 Gonzalez ............... H01Q 1/242
343/702
(Continued)

OTHER PUBLICATIONS

Ruben Gregory Puthota Dominic Savio ("Design of Next Generation Antenna Mount in Telecommunication Towers With Low Effective Projected Area", The University of Texas at Arlington, 2015, pp. 1-53) (Year: 2015).*
(Continued)

*Primary Examiner* — Iftekhar A Khan
(74) *Attorney, Agent, or Firm* — Quicker Law, LLC

(57) ABSTRACT

A method includes rendering, by a user interface of a computing device, a plurality of antenna mount options. The method includes receiving a selection of an antenna mount option. The method includes generating a geometry of a tower and the antenna mount option including a relative position of each of a plurality of tower components based on a load bearing capacity of the tower and the antenna mount option. The method includes rendering the generated geometry. The method includes generating, using the geometry and the load bearing capacity, an input file for a modeling program. The method includes importing the input file to the modeling program and running the modeling program, wherein the modeling program performs a structural analysis of the tower and the antenna mount option. The method includes rendering a result of the structural analysis including a stress and strain of the tower and the antenna mount option.

9 Claims, 9 Drawing Sheets

(51) Int. Cl.
*H01Q 21/00* (2006.01)
*H01Q 1/24* (2006.01)
*G06F 30/13* (2020.01)

(58) Field of Classification Search
USPC .................................................. 703/7
See application file for complete search history.

(56) References Cited

U.S. PATENT DOCUMENTS

| | | | | |
|---|---|---|---|---|
| 5,402,135 A * | 3/1995 | DeMarre | H01Q 1/084 | 343/715 |
| 5,920,291 A * | 7/1999 | Bosley | H01Q 1/1242 | 343/892 |
| 5,971,345 A * | 10/1999 | Khalaf | H01Q 1/125 | 248/512 |
| 6,052,092 A * | 4/2000 | Davis | H01Q 1/1242 | 343/757 |
| 6,232,928 B1 * | 5/2001 | Zimmerman | H01Q 1/1242 | 343/882 |
| 6,262,691 B1 * | 7/2001 | Austin | H01Q 1/1221 | 343/878 |
| 6,513,299 B1 * | 2/2003 | Damiano | E04H 12/10 | 343/874 |
| 6,563,475 B2 * | 5/2003 | Ianello | H01Q 1/1242 | 248/219.4 |
| 6,690,328 B2 * | 2/2004 | Judd | H01Q 21/08 | 343/701 |
| 6,739,561 B2 * | 5/2004 | Herzog | H01Q 1/1221 | 248/218.4 |
| 7,106,273 B1 * | 9/2006 | Brunson | H01Q 1/246 | 343/890 |
| 7,113,145 B1 * | 9/2006 | Noble | H01Q 1/1228 | 248/218.4 |
| 7,659,865 B2 * | 2/2010 | Kreitzberg | H01Q 1/1235 | 343/880 |
| 8,023,826 B2 * | 9/2011 | Fasshauer | H01Q 1/246 | 398/116 |
| 8,305,286 B2 * | 11/2012 | Frank | H01Q 1/1221 | 343/878 |
| 8,305,289 B2 * | 11/2012 | Lo | H01Q 1/125 | 343/890 |
| 8,583,063 B1 * | 11/2013 | Lee | H01Q 1/242 | 455/129 |
| 8,593,370 B2 * | 11/2013 | Caldwell | H01Q 1/1242 | 343/890 |
| 9,596,617 B2 * | 3/2017 | Priest | H04W 24/08 | |
| 10,150,661 B2 * | 12/2018 | Priest | B66F 11/04 | |
| 10,728,769 B1 * | 7/2020 | Jotshi | G06K 9/00664 | |
| 2004/0090382 A1 * | 5/2004 | Kushihi | H01Q 1/2283 | 343/700 MS |
| 2004/0125032 A1 * | 7/2004 | Ikuta | H01Q 1/2283 | 343/702 |
| 2009/0040120 A1 * | 2/2009 | Tsubaki | H01Q 9/0421 | 343/702 |
| 2011/0250926 A1 * | 10/2011 | Wietfeldt | H01Q 9/14 | 455/525 |
| 2011/0279347 A1 * | 11/2011 | Pass | E04G 3/243 | 343/890 |
| 2012/0244895 A1 * | 9/2012 | Thomas | H04B 7/0822 | 455/500 |
| 2013/0221182 A1 * | 8/2013 | Renilson | H01Q 1/125 | 248/534 |
| 2014/0179244 A1 * | 6/2014 | Colapietro | H01Q 1/246 | 455/90.2 |
| 2014/0327768 A1 * | 11/2014 | Marshall | H04N 7/183 | 348/143 |
| 2015/0059500 A1 * | 3/2015 | Conrad | H01Q 1/1242 | 74/89.14 |
| 2016/0211569 A1 * | 7/2016 | Skrepcinski | H01Q 1/1228 | |
| 2016/0248151 A1 * | 8/2016 | Proshold | H01Q 1/005 | |
| 2016/0322697 A1 * | 11/2016 | Skrepcinski | H01Q 1/1235 | |
| 2016/0336641 A1 * | 11/2016 | DiPiero | F16M 13/02 | |
| 2018/0277921 A1 * | 9/2018 | Ming | H01Q 1/12 | |
| 2018/0331721 A1 * | 11/2018 | Adriazola | H01Q 1/12 | |
| 2020/0162936 A1 * | 5/2020 | Terry | H04W 16/22 | |

OTHER PUBLICATIONS

Eric James Sullins ("Analysis of Radio Communication Towers Subjected to Wind, Ice and Seismic Loadings", University of Missouri—Columbia, 2006, pp. 1-105) (Year: 2006).*

Rodriguez et al. (Effects of Antennas on Structural Behavior of Telecommunication Towers, 2016, SpringerLink, pp. 1-20) (Year: 2016).*

* cited by examiner

SYSTEMS AND METHODS FOR TOWER ANTENNA MOUNT ANALYSIS AND DESIGN

CROSS-REFERENCE TO RELATED APPLICATION

The present application claims the benefit of U.S. provisional Application No. 62/484,752, filed Apr. 12, 2017, which is incorporated herein by reference.

TECHNICAL FIELD

This disclosure pertains generally, but not by way of limitation, to analyzing and designing base transceiver station towers and base transceiver station tower antenna mounts. More specifically, the present disclosure is related to systems, methods, and user interfaces for analyzing and designing base transceiver station towers and base transceiver station tower antenna mounts.

BACKGROUND

A base transceiver station towers may be installed with one or more antenna mounts. An antenna mount may be configured to support one or more antennas. Trends in antenna design have shifted to heavier models. Deployed base towers may be installed with antenna mounts that were not designed to support antennas with the weight of recent models. In order to determine whether a tower and an antenna mount may support an antenna, a structural analysis may be performed. The structural analysis may determine structural integrity of the tower and compliance of the tower with respect to regulatory requirements.

Performing a structural analysis of a base transceiver station tower and a base transceiver station tower antenna mount may be an onerous task. Performing the structural analysis after a tower has been deployed may require gathering data at the site of the tower. For example, attributes of an older model of an antenna mount may not be accessible. To determine the attributes, such as dimensions of the antenna mount, a team may need to climb the tower and take measurements.

After the information is gathered at the site of the tower, the information may be sent to an engineer or individual trained to analyze the information. The analysis may be time-consuming and susceptible to human error. The analysis must be performed by a modeling program. However, initial calculations must be performed in order to prepare an input file for the modeling program. The calculations may require skill and time and may be susceptible to human error. After the calculations are performed, an input file must be prepared. The input file may comprise an esoteric scripting language and a unique file format.

Gathered data, calculations, and analysis of the base transceiver station tower and the base transceiver station tower antenna mount may be recorded digitally or physically. For an entity with various towers, management of the records may be a challenge. The records may be lost. If the records are not stored a central location, the records may not be easily accessible. Traditional structural analysis of base transceiver station towers and base transceiver station tower mounts may be improved.

SUMMARY

An analysis may be performed to determine whether a tower and an antenna mount may support one or more antennas or tower equipment. Methods for analyzing and designing base transceiver station towers and base transceiver station antenna mounts may be performed via a user device. The user device may execute an application configured to analyze and design base tower and antenna mounts. The application may comprise a graphical user interface. The graphical user interface may be displayed via a display of the user device.

The user device may receive a mapping report. The mapping report may comprise attributes of one or more of a tower, an antenna mount, an antenna, and tower equipment. Attributes may comprise quantitative properties, such as a weight, dimension, or other numerical value. Attributes may comprise qualitative properties, such as a brand or a model. The mapping report may comprise information entered in a template, such as using the application. The user device may import the mapping report to the application.

The user device may compute a load bearing capacity and a geometry of the antenna mount based on the mapping report. The geometry may comprise a relative position of one or more components of the tower and the antenna mount. The components may comprise at least one of tower equipment and a tower attachment, such as an antenna, a mount, a dish, a support, or an attachment set. The user device may generate the geometry based at least on the load bearing capacity. The user device may generate the geometry based at least on a weight of at least one of the tower components. The user device may compute the weight of one or more of the antenna mount, one or more antenna mount members, one or more antennas, and one or more tower components.

The user device may display the load bearing capacity and the geometry, such as via the graphical user interface of the application. The user device may display the attributes of the mapping report. The user device may generate a graphical representation of the tower and the antenna mount based on at least one of the mapping report and the computed geometry and the load bearing capacity. The user device may display the graphical representation.

The user device may receive a request to generate an input file for a modeling program. The user device may generate the input file for the modeling program. The input file may comprise the computed geometry and load bearing capacity. The user device may receive a request to run the modeling program. The user device may run the modeling program using the input file. The modeling program may generate a result, such as a stress and strain distribution or curve for the tower and the antenna mount.

The user device may receive a request for a modification model. The user device may determine a modification element, such as an alternate antenna, alternate tower equipment, a support element or a reinforcement element. The user device may generate an input file for the modeling program. The input file may comprise the modification element. The user device may run the modeling program using the input file. The modeling program may generate a result, such as a stress and strain distribution or curve for the tower and the modification element. The user device may display the result of the modeling program.

BRIEF DESCRIPTION OF THE DRAWINGS

The following drawings illustrate generally, by way of example, but not by way of limitation, various examples discussed in the present disclosure. In the drawings:

FIG. 4 shows an example graphical user interface for analyzing and designing a base transceiver station tower and a base transceiver station tower antenna mount.

FIG. 5 shows an example graphical user interface for analyzing and designing a base transceiver station tower and a base transceiver station tower antenna mount.

DETAILED DESCRIPTION

The disclosure describes methods and systems for analyzing and designing base transceiver station towers and base transceiver station antenna mounts. An analysis may be performed to determine whether a tower and an antenna mount may support one or more antennas. The analysis may be performed to determine whether the tower and the antenna mount may support tower equipment. The analysis may be performed to determine whether the tower and the antenna mount meets a regulatory requirement when installed with one or more antennas or tower equipment. The analysis may be performed to select an antenna or equipment to install on a tower or antenna mount.

The analysis may comprise computing a geometry of the antenna mount. The geometry of the antenna mount may comprise geometries of one or more members of the antenna mount. The analysis may comprise computing the geometry of one or more antennas. The analysis may comprise computing the weight of one or more of the antenna mount, one or more antenna mount members, and one or more antennas.

The analysis may comprise computing a load bearing capacity of the tower and the antenna mount. The analysis may comprise computing a load bearing capacity of an antenna or equipment on the tower and the antenna mount. The load bearing capacity may comprise one or more of a maximum wind load, ice load, or dead load.

The analysis may comprise modeling tower and the antenna mount installed with one or more antennas and tower equipment. The analysis may be performed using a modeling program. The analysis may comprise simulating the tower and the antenna mount installed with one or more antennas and tower equipment. The modeling or the simulating may be used to determine a stress and strain curve or distribution of the tower and the antenna mount installed with the one or more antennas and the tower equipment. The stress and strain curve or distribution may be used to determine whether the tower and the antenna mount meets a regulatory requirement if installed with one or more antennas or tower equipment. The a stress and strain curve or distribution may be used to determine structural integrity of the tower and the antenna installed with one or more antennas or tower equipment.

Figure 1:
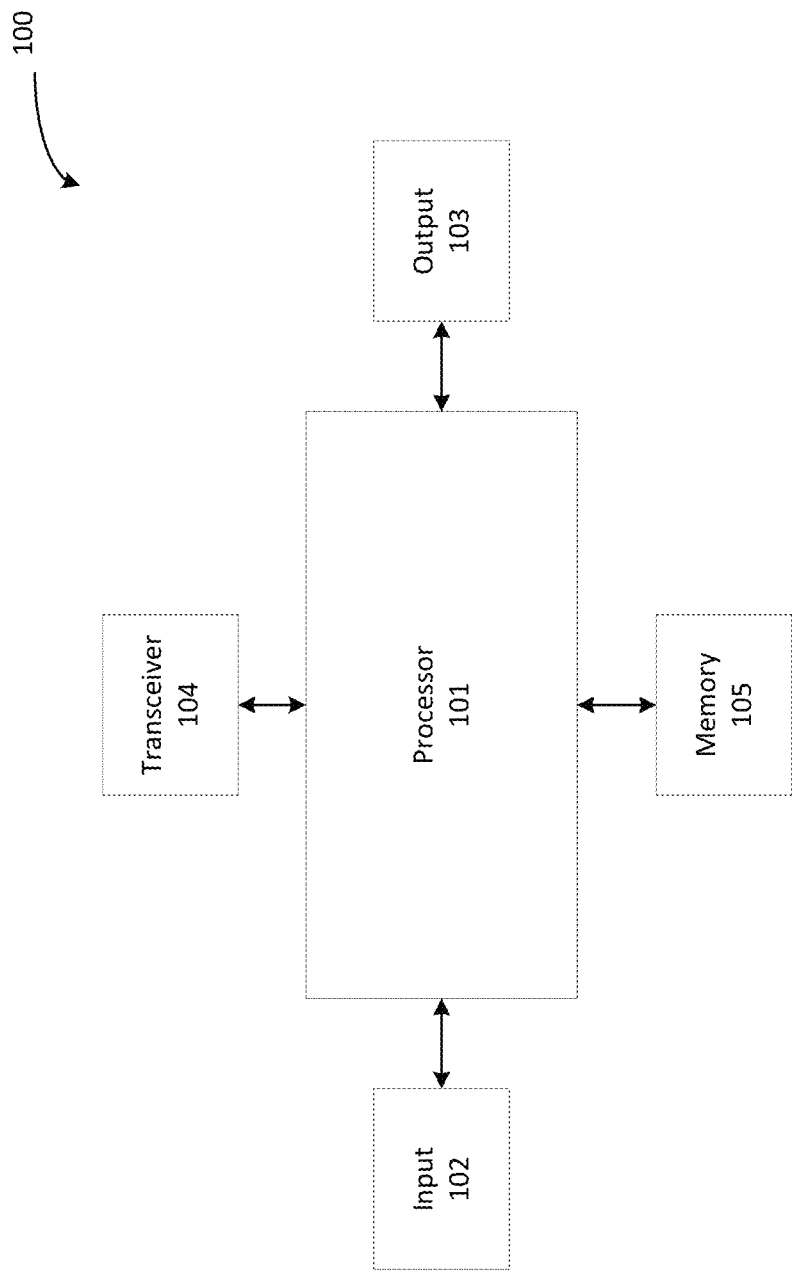
FIG. 1 shows an exemplary computing system.

Methods for analyzing and designing base transceiver station towers and base transceiver station antenna mounts may be performed via a user device. FIG. 1 shows an example computing system of a user device 100. The user device 100 may comprise a computing device, such as a desktop computer or a server. The user device 100 may comprise a mobile device, such as a laptop, a tablet device, a mobile phone, or a personal digital assistant.

The user device 100 may connect to a network, such as the Internet. The user device 100 may connect to the internet by one or more types of communication channels, such as cellular, wireless, optical, Ethernet, or satellite channels.

The user device 100 may comprise a processor 101. The processor 101 may execute instructions or execute operations. The processor 101 may communicate with a remote device. The processor 101 may access a remote database. The processor 101 may access a remote database while executing instructions or an operation. The user device 100 may comprise one or more inputs. The one or more inputs may comprise a keyboard, mouse, touchscreen, camera, microphone, or any other suitable input mechanism. The user device 100 may comprise one or more outputs 103. The one or more outputs 103 may comprise a display screen and an audio speaker. The one or more outputs 103 may comprise an interactive graphical user interface (GUI). The GUI may display images or information associated with information base transceiver station towers based on input selections received by the inputs 132.

The user device 100 may comprise one or more transceivers 104. The transceiver 104 may be configured to receive computer instructions, executable applications, a database, or data files, such as from another device.

The user device 100 may comprise a memory 135. The memory 135 may store data received from the transceiver 104. The memory 135 may store data to be output by the one or more outputs 103. The memory 135 may store input selections received by the inputs 102. In one aspect, the memory 135 may store instructions or data that the processor 101 may execute to carry out operations. The memory 135 may store a database, such as a tower database or antenna database. The memory 135 may comprise suitable storage devices for tangibly embodying computer program instructions. Data may comprise any form of non-volatile memory, such as semiconductor memory devices, like EPROM, EEPROM, and flash memory devices; magnetic disks like internal hard disks and removable disks; magneto-optical disks; and CD-ROM disks.

Figure 2:
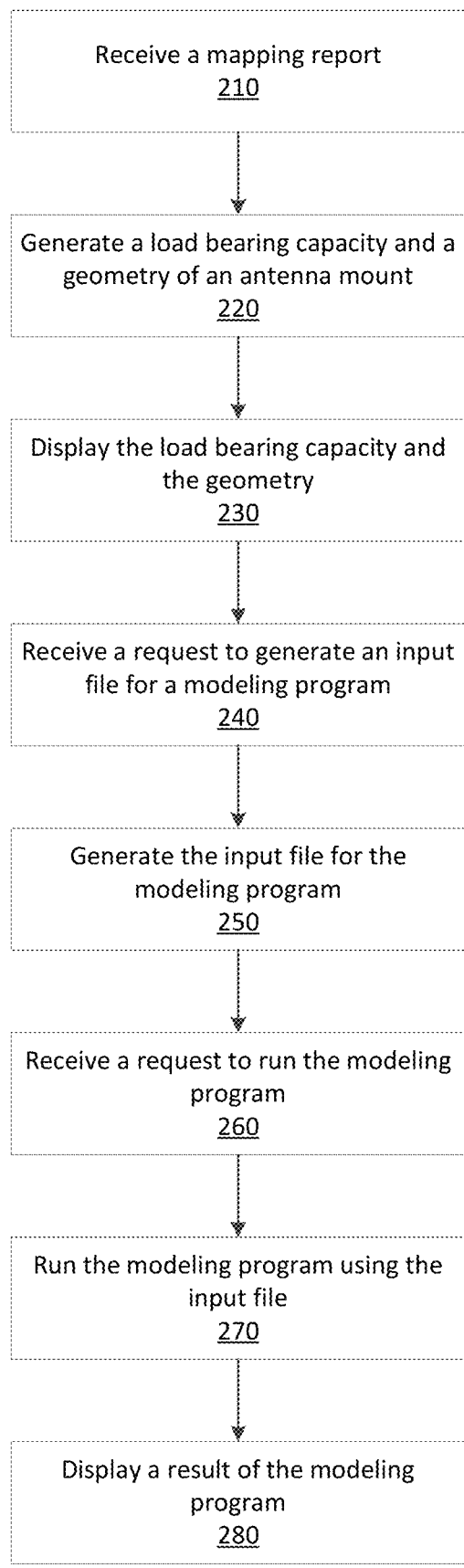
FIG. 2 shows an exemplary method for analyzing and designing a base transceiver station tower and a base transceiver station tower antenna mount.

FIG. 2 shows a flow diagram of an example method for analyzing and designing base transceiver station towers and base transceiver station antenna mounts. One or more of the steps described in FIG. 2 may be executed on the computing system of the user device 100. For example, the user device 100 may be loaded with an executable application, such as software or a web portal. The executable application may comprise a program written in a programming language such as C++. The executable application may comprise a program that uses a relational database management system, such as Microsoft SQL server. The processor 101 of the user device 100 may execute the executable application. The application may enable a user to perform an analysis of a base transceiver station tower and a base transceiver station tower antenna mount. The application may enable a user to input information associated with a tower or an antenna mount. The application may compute structural properties of a tower or an antenna mount based on the information. The steps of FIG. 2 may be performed in response to one or more inputs received by the user device 100. The one or more inputs may be received by the user device 100 by a user interacting with one or more of the GUI show in FIGS. 4-9.

Prior to step 210 (or otherwise), the user device 100 may receive or access a user registration. Receiving or accessing the user registration may comprise the user device 100 receiving data from the input 102. The data may be generated by prompting or having a user of the user device enter the data. Entering the data may comprise typing in the data or selecting objects using the input 102. Selecting objects may comprise using a touchscreen keyboard or drop-down selections displayed using the graphical user interfaces via the output 103. The objects may comprise icons, menu options, or keys, for example. The user registration information may be used to prevent unauthorized access or restrict access to certain information stored on the computing device 120 or the user device 100. The user registration information may be used to categorize or store data, such as data associated with use of the application, data generated during use of the application, or data retrieved during use of the application.

At step 210, the user device 100 may receive a mapping report. The modelling report may be prepared using a software application such as RISA by RISA Technologies, Inc., STAAD.Pro by Bentley Systems, Inc., SAP2000 v18 by Computers and Structures, Inc., or Etabs 2013 by Computers and Structures, Inc. Other applications and methods may be used. As an example a mapping report may comprise a model of a component or system and the model may be loaded into the user device 100 for further processing. The mapping report may comprise attributes of one or more of a tower, an antenna mount, an antenna, and tower equipment. Attributes may comprise quantitative properties, such as a weight, dimension, or other numerical value. Attributes may comprise qualitative properties, such as a brand or a model. As an illustrative example, attributes of a tower may comprise structure type and height. Attributes of an antenna mount may comprise height, geometries, members, and bolts. Geometries may comprise a shape and a dimensions of the antenna mount. Members may comprise antenna mount components. Attributes may comprise member dimensions, such as inner diameter and outer diameter or a length across one or more axis. Attributes may comprise an antenna model, width, depth, height, coaxial size, coaxial quantity, and image. The attributes may comprise antenna mounting locations such as vertical distances from a midpoint of the antenna, horizontal offset with respect to a mount, such as distance from the center mounting pipe of a mount sector. The attributes may comprise one or more units of measurement.

The mapping report may comprise a plurality of columns and rows. The mapping report may comprise a spreadsheet. The mapping report may comprise a form or template. The template may comprise a plurality of fields. Each of the plurality of fields may be associated with a tower, antenna mount, antenna, or tower equipment attribute. The plurality of fields may be labeled. The labels may comprise an indication of the attribute associated with the plurality of fields.

The template may be generated by the user device 100. The template may be generated using the executable application. The user device 100 may generate the template with the plurality of fields blank. The user device 100 may display the template via the output 103. The user may collect the attributes. For example, the user may visit the site of a tower. The user may measure and record attributes of the tower and the antenna mount of the tower. The user may fill at least a portion of the plurality of blank fields with attributes associated with the attributes. The user may submit the template to the user device. The user device 100 may receive the template via the input 102. The user device may receive the template via a GUI of the executable application.

The user device 100 may store the template or the attributes in the memory 103. The template and the attributes may be stored temporarily or for a duration that the executable program is running in a single session. The template and the attributes may be saved to the memory 103 for future use, such as use after the executable program has been closed or terminated.

The user device 100 may receive a selection to import the mapping report to the executable application. The user device 100 may load the mapping report to the application. The user device 100 may load the mapping report from the memory 103. The user device 100 may extract the attributes from the mapping report and store the attributes in the memory 103 or load the attributes to the application. Alternatively, the user device 100 may receive a request to load a mapping report that was previously received. The mapping report may be stored on the memory 135.

Any number and types of components and systems may be modelled using various software such as RISA by RISA Technologies, Inc., STAAD.Pro by Bentley Systems, Inc., SAP2000 v18 by Computers and Structures, Inc., or Etabs 2013 by Computers and Structures, Inc. However, the models may have structural information such as a spatial data and may not include load data a maximum wind load, ice load, or dead load capacity of the antenna mount. As described herein, a model may be loaded onto the user device (or otherwise accessed) and may be updated to include the load data. The updated model may then be exported, such as in a format compatible with the original model file.

At step 220, the user device 100 may generate a load bearing capacity of the antenna mount. The load bearing capacity may comprise a maximum wind load, ice load, or dead load capacity of the antenna mount. The user device 100 may generate the load bearing capacity based on the mapping report. The user device 100 may use the attributes of the mapping report to generate the load bearing capacity. Computing the load bearing capacity may comprise running a simulation or an analysis. Computing the load bearing capacity may comprise using an algorithm or a function. The attributes may be entered in the algorithm or function and the load bearing capacity may be computed.

The user device 100 may generate a geometry of the antenna mount. The user device 100 may compute a geometry of the antenna mount based on the mapping report. The user device 100 may generate the geometry based on geometries of components of the antenna mount provided in the mapping report. The geometry may comprise a relative position of one or more components of the tower and the antenna mount. The components may comprise at least one of tower equipment and a tower attachment, such as an antenna, a mount, a dish, a support, or an attachment set. The user device 100 may generate the geometry based at least on the load bearing capacity. The user device 100 may generate the geometry based at least on a weight of at least one of the tower components. The user device 100 may compute the weight of one or more of the antenna mount, one or more antenna mount members, one or more antennas, and one or more tower components.

Alternatively, if the user device 100 previously computed the load bearing capacity and the geometry for the mapping report, the user device 100 may load the computed load bearing capacity and the geometry. The computed load bearing capacity and the geometry may be stored on the user device 100. It is understood that the mapping report or other model may have one or both of the load bearing capacity or geometry, and/or other spatial data, load data, or other data.

At step 230, the user device 100 may display the load bearing capacity of the antenna mount and the geometry of the antenna mount. The user device 100 may display the load bearing capacity and the geometry via the output 103. The user device may display the load bearing capacity and the geometry via the output 103. The user device 100 may render the load bearing capacity and the geometry of the antenna mount via the GUI of the executable application. The user device 100 may fill data fields with the load bearing capacity and the geometry. The user device 100 may display the data fields via the GUI.

The user device 100 may display the attributes from the mapping report. The user device 100 may display the attributes using the output 103. The user device 100 may render the attributes from the mapping report via the GUI. The user device 100 may extract the attributes from the mapping report. The user device 100 may fill data fields with the attributes and display the data fields via the GUI. Depending on the size and type of the user device 100, the GUI may not show all of the attributes. The GUI may be manipulated to show additional attributes. For example, a large block of text comprising information may not display as a whole on the screen of the user device 100. The user may scroll up, down, left, or right to reveal the rest of the text. As another example, a plurality of parameters may be viewed when the user scrolls up, down, left, or right, such as in panel in which the parameters may be displayed.

The user device 100 may generate a graphical representation of the tower and the antenna mount. The user device 100 may generate a graphical representation of the tower and the antenna mount comprising the computed geometry. The user device 100 may generate a graphical representation of the tower and the antenna mount according to the attributes. The user device 100 may display the graphical representation via the output 103. The user device 100 may render the graphical representation via the GUI of the executable application.

At step 240, the user device 100 may receive a request to generate an input file for a modeling program. The user device 100 may receive the request by a user selecting an icon on the GUI. The user device 100 may receive the selection via the input 102. The receiving the selection may comprise the user device 100 receiving data from the input 102. The data may be generated by having or prompting the user to type in or select objects using the input 132. The objects may comprise icons, menu options, or keys, for example. The data may be generated by the user using a touchscreen keyboard or drop-down selections.

The modeling program may comprise software, such as RISA by RISA Technologies, Inc., STAAD.Pro by Bentley Systems, Inc., SAP2000 v18 by Computers and Structures, Inc., or Etabs 2013 by Computers and Structures, Inc. The modeling program may comprise program that performs a simulation of the tower and the antenna mount installed with one or more antenna and tower equipment. The modeling program may perform a stress and strain curve or distribution for the tower and the antenna mount installed with one or more antenna and tower equipment. The modeling program may perform a simulation or analysis using the computed antenna mount geometry and load bearing capacity.

At step 250, the user device 100 may generate the input file for the modeling program. The input file may comprise a text file. The input file may comprise script file. The input file may comprise a format specific to the modeling program. For example, an input file for RISA may comprise a .r3d file. An input file for the STAAD may comprise a .std file. The input file may comprise attributes from the mapping report. The input file may comprise the computed geometry and load bearing capacity. The user device 100 may store the generated input file temporarily or for future use. The user device 100 may store the generated input file on the memory 103.

At step 260, the user device 100 may receive a request to run the modeling program. The user device 100 may receive the request by a user selecting an icon on the GUI. The user device 100 may receive the selection via the input 102. The receiving the selection may comprise the user device 100 receiving data from the input 102. The data may be generated by having or prompting the user to type in or select objects using the input 102. The objects may comprise icons, menu options, or keys, for example. The data may be generated by the user using a touchscreen keyboard or drop-down selections.

At step 270, the user device 100 may run the modeling program using the input file. The user device 100 may import the input file to the modeling program. The processor 101 of the user device may execute the modeling program. The modeling program may produce a result. The result may comprise a stress and strain distribution of the tower and the antenna mount installed with at least one of the antenna and the tower equipment. The result may comprise a stress and strain curve of the tower and the antenna mount installed with at least one of the antenna and the tower equipment. The user device 100 may save the result of the modeling program.

At step 280, the user device 100 may display a result from the modeling program. The user device 100 may display the result textually and/or graphically using the output 103 of the user device. The user device 100 may render the result via the GUI. The user device 100 may fill data fields with the result and display the data fields via the GUI. The user may use the result to determine whether the analyzed tower and antenna mount installed with one or more antenna and tower equipment is structurally sound. The user may use the result to determine whether the analyzed tower and antenna mount installed with one or more antenna and tower equipment meets a regulatory requirement. The user device 100 may receive an indication of the user's assessment of the analyzed tower and antenna mount installed with one or more antenna and tower equipment. For example, the user may select a "fail" icon or a "pass" icon on the GUI.

Figure 3:
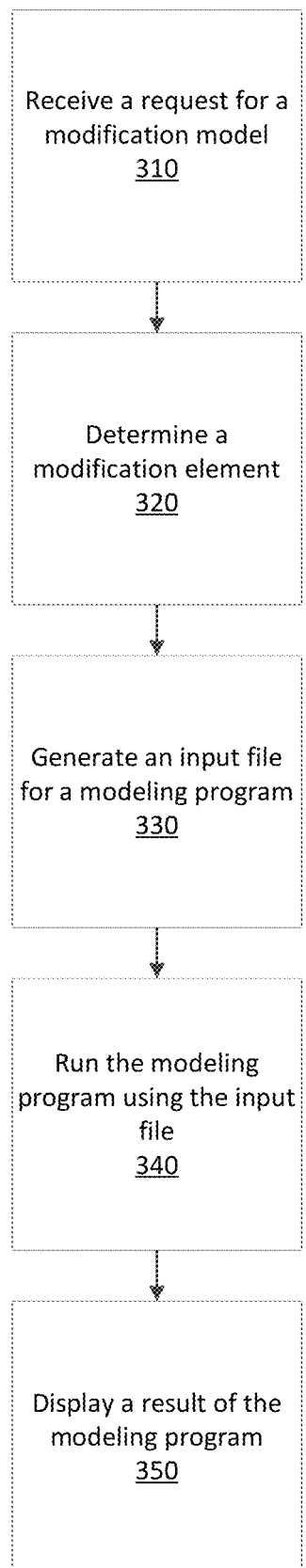
FIG. 3 shows an exemplary method for analyzing and designing a base transceiver station tower and a base transceiver station tower antenna mount.

If a tower and antenna mount installed with one or more antenna and tower equipment is determined to be unsatisfactory or if a user wishes to consider other antenna or tower equipment for the tower and the antenna mount, a modified design may be generated by the user device 100. An analysis of an alternate antenna or tower equipment installed on the tower and the antenna mount may be performed by the user device 100. FIG. 3 shows an example method for analyzing and designing a modified tower and antenna mount.

At step 310, the user device 100 may receive a request for a modification model. The user device 100 may receive the request by a user selecting an icon on the GUI. The user device 100 may receive the selection via the input 102. The receiving the selection may comprise the user device 100 receiving data from the input 102. The data may be generated by having or prompting the user to type in or select objects using the input 102. The objects may comprise icons, menu options, or keys, for example. The data may be generated by the user using a touchscreen keyboard or drop-down selections.

The user device 100 may receive the request after running the modeling program, as in step 270 in FIG. 2, or after displaying the result of a modeling program, as in step 280 in FIG. 2. Receiving the request for the modification model may comprise receiving an indication of an unsatisfactory result of the modeling program, such as "fail" rating.

At step 320, the user device 100 may determine a modification element. The modification element may comprise an alternate antenna or alternate tower equipment. The modification element may comprise a support element or a reinforcement element.

Determining the modification element may comprise accessing or querying a database. The database may comprise a database of tower or antenna mount components. The database may comprise a database of antennas. The user device 100 may determine the modification element based on the result of the modeling analysis. The user device 100 may determine the modification element based on a computed load bearing capacity or geometry of the antenna mount. The user device 100 may determine the modification element based on a computed weight of one or more of an antenna, a tower equipment, and the antenna mount. The user device 100 may determine the modification element based on a user input. The user input may comprise a selection or an indication of a tower component to be modified. The user device 100 may receive a selection of the modification element, such as by receiving a selection of an option on a menu via the GUI.

The user device 100 may import the modification element to the executable application. The user device 100 may display the modification element via the output 103. The user device 100 may render the modification element via the GUI of the executable application. The user device 100 may generate a graphical representation of the tower and the antenna mount coupled to the modification element. The user device 100 may display the graphical representation via the output 103. The user device 100 may render the graphical representation via the GUI of the executable application.

At step 330, the user device 100 may generate an input file for a modeling program. The modeling program may be the same modeling program described in FIG. 2. The modeling program may comprise software, such as RISA by RISA Technologies, Inc., STAAD.Pro by Bentley Systems, Inc., SAP2000 v18 by Computers and Structures, Inc., or Etabs 2013 by Computers and Structures, Inc. The modeling program may comprise program that performs a simulation of the tower and the antenna mount installed with the modification element. The modeling program may perform a stress and strain analysis for the tower and the antenna mount installed with the modification element. The modeling program may perform a simulation or analysis using the computed antenna mount geometry and load bearing capacity.

The input file may comprise a text file. The input file may comprise a script file. The input file may comprise a format specific to the modeling program. For example, an input file for RISA may comprise a .r3d file. An input file for the STAAD may comprise a .std file. The user device 100 may store the generated input file temporarily or for future use. The user device 100 may store the generated input file on the memory 103.

Prior to generating the input file, the computing device 100 may generate a load bearing capacity, a geometry, and a weight for the tower, the antenna mount, and the modification element. Alternatively, the computing device 100 may load a file comprising one or more of a load bearing capacity, a geometry, and a weight for the tower and the antenna mount. The computing device 100 may update the information to account for the modification element. The computing device 100 may display the updated information by the GUI.

At step 340, the user device 100 may run the modeling program using the input file generated in step 330. The user device 100 may import the input file to the modeling program. The processor 101 of the user device may execute the modeling program. The modeling program may produce a result. The result may comprise a stress and strain distribution of the tower and the antenna mount installed with the modification element. The result may comprise a stress and strain curve of the tower and the antenna mount installed with the modification element.

At step 350, the user device 100 may display the result of the modeling program. The user device 100 may display the result textually and/or graphically using the output 103 of the user device. The user device 100 may render the result via the GUI. The user device 100 may fill data fields with the result and display the data fields via the GUI. The user may use the result to determine whether the analyzed tower and antenna mount installed with the modification element is structurally sound. The user may use the result to determine whether the analyzed tower and antenna mount installed with the modification element meets a regulatory requirement. The user device 100 may receive an indication of the user's assessment of the analyzed tower and antenna mount installed with one or more antenna and tower equipment. For example, the user may select a "fail" icon or a "pass" icon on the GUI. The user device 100 may save the result of the modeling program.

FIGS. 4-9 show exemplary GUIs for analyzing and designing base transceiver station towers and base transceiver station antenna mounts. The GUIs may be associated with an executable application on the user device 100. FIGS. 4-9 show GUIs configured for display in landscape mode. The GUIs may be configured for display in portrait mode. The GUIs may be adapted for display on mobile electronic devices such as laptops, tablets, personal digital assistants, or mobile phones. The GUIs may be adapted for display on desktop computers, kiosks, or other devices that may not be configured for mobile use.

In order to access one or more of the GUIs in FIGS. 4-9, a user login or registration page may be rendered for the user to create or validate an account. Creation or validation of the account may be necessary for the user to fully access the executable application on the user device 100 and for the user device 100 to interact with the computing device 120. The GUIs may comprise fields for receiving a "Login ID" and a "password". The GUIS may comprise buttons for clearing the fields or submitting the inputs of the fields for further processing. An icon or button for "Forget Password?" may be provided to assist with retrieving a lost password. An icon or button may be rendered to guide the operator through a registration process.

Figure 4:
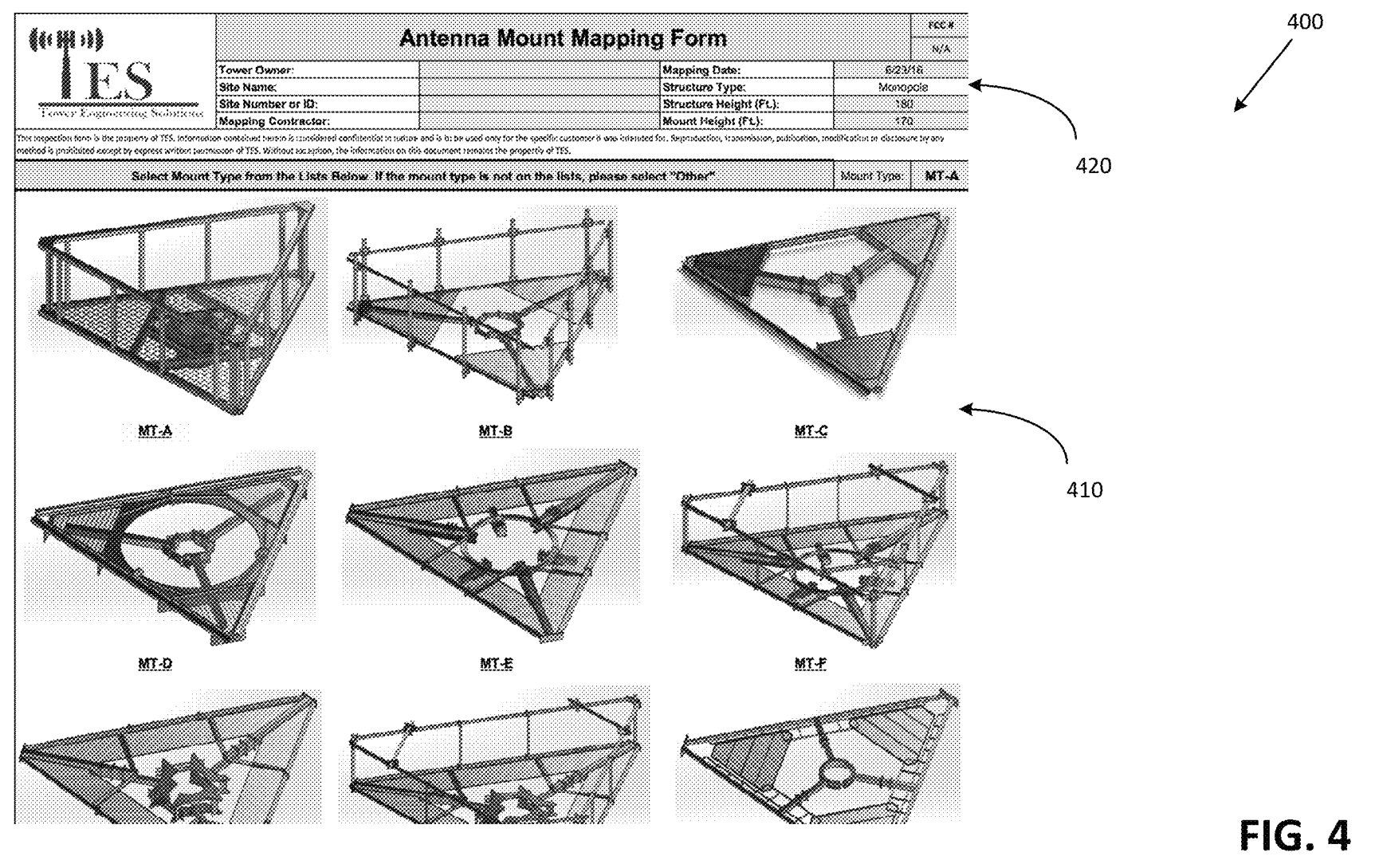

The user device 100 may generate GUI displays. The GUIs may comprise a plurality of regions, such as tables, sections, windows, images, or interfaces. FIG. 4 shows an exemplary GUI 400. The GUI comprises a mapping form. The mapping form may enable a user to prepare a mapping report, like the mapping report described in step 210 in FIG. 2. A user may enter information in the mapping form and the information entered may comprise the mapping report. The mapping form may comprise a menu of antenna mounts 410.

The menu of antenna mounts may comprise a plurality of antenna mount types, such as models or shapes. The menu may comprise a plurality of graphical representations of antenna mounts. The menu map comprise text associated with the antenna mounts, such as model numbers. The user device 100 may receive a selection of an antenna mount by a user interacting with one of the graphical representations or texts, such as by clicking or dragging.

The mapping form may comprise a bar 420 with fields and input boxes. The boxes may be labeled with text indicating information to be entered in the boxes. The information may comprise preliminary information, such as an identifier of a tower owner, an identifier of a tower site, a structure type of a tower, a date, a height of the tower, and a height of the antenna mount. A user may enter an input in the each of the boxes, such as by typing with a keypad of the user device 100. The user device 100

Figure 5:
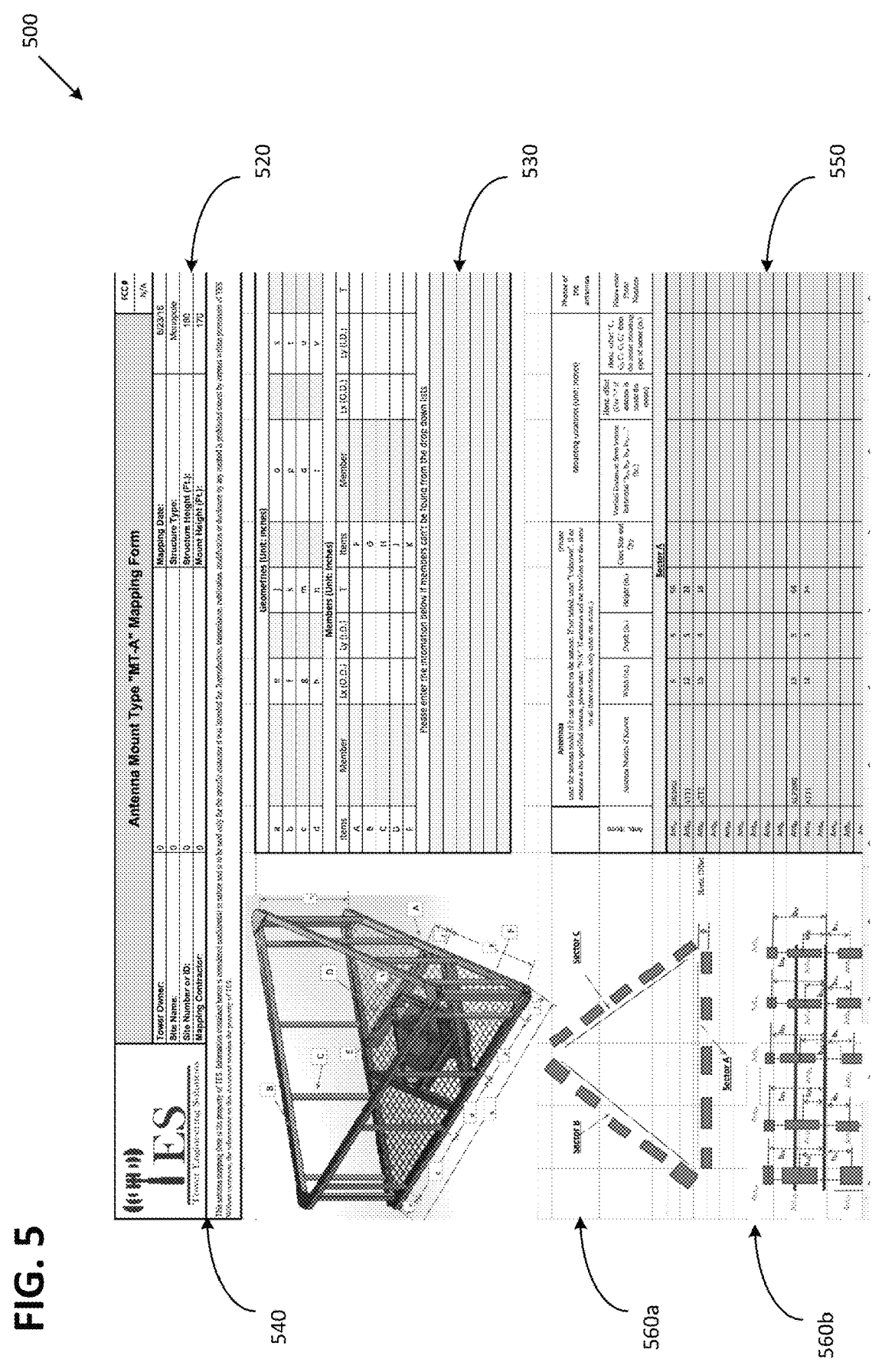

FIG. 5 shows an exemplary GUI 500. The GUI 500 may be displayed after the GUI 400 in FIG. 4 is displayed by the user device 100. The user device 100 may display the GUI 500 after receiving information via the GUI 400. The GUI 500 may comprise a bar 520 with fields and input boxes. The bar 520 may be like the bar 420 in FIG. 4. The boxes may be labeled with text indicating information to be entered in the boxes. The information may comprise preliminary information, such as an identifier of a tower owner, an identifier of a tower site, a structure type of a tower, a date, a height of the tower, and a height of the antenna mount. A user may enter an input in the each of the boxes, such as by typing with a keypad of the user device 100. The user device 100

The GUI 500 may comprise a template or a spreadsheet for preparing a mapping report. The user device 100 may generate the template or spreadsheet, such as using the executable application. The GUI 500 may comprise an antenna mount log 530. The antenna mount log may comprise a plurality of input boxes. The plurality of input boxes may correspond to attributes of an antenna mount. The plurality of input boxes may correspond to attributes of the antenna mount selected in the antenna mount menu 410 of the GUI 400 in FIG. 4. The attributes may be indicated by labels. The attributes may comprise dimensions of geometries of the antenna mount. The geometries of the antenna mount may comprise geometric areas of the antenna mount or an antenna mount frame. The GUI 500 may comprise an antenna mount schematic 540, which may assist a user in locating the geometries of the antenna mount when taking measurements. The antenna mount schematic 540 may comprise a graphical representation of the antenna mount selected in the antenna mount menu 410. The user device 100 may generate the antenna mount schematic 540 based on an indication of an antenna mount type. The geometries may be indicated by the antenna mount schematic 540, such as by portions identified by the lower case letters.

The attributes of the antenna mount may comprise attributes of antenna mount members. The antenna mount members may comprise sides or components of the antenna mount or of an antenna mount frame. The attributes may comprise dimensions of the members, such as a length, an inner diameter, or an outer diameter. The members may be indicated by the antenna mount schematic 540, such as the parts identified by the upper case letters.

The input boxes may enable a user to enter information corresponding to the labels. A user may input information using a keyboard of the user device 100, for example. The input boxes may comprise drop down menus. The drop down menus may comprise options that may be selected to fill one or more input boxes.

The GUI 500 may comprise an antenna log 550. The antenna log 550 may comprise a plurality of input boxes. The plurality of input boxes may correspond to attributes of one or more antennas. The attributes may be indicated by labels. The attributes may comprise, for example, an antenna model, antenna dimensions, antenna mounting locations, and an antenna photo. The antenna dimensions may comprise an antenna width, depth, height, coaxial size, and coaxial quantity. The mounting locations may comprise a vertical distance from an antenna mount component, a horizontal offset distance from the antenna mount, and a horizontal offset distance from a center mounting pipe of a sector of an antenna mount.

The GUI 500 may comprise an antenna schematic 560. The antenna schematic 560 may indicate one or more of the attributes. The antenna schematic 560 may comprise a reference or key to assist a user taking measurements. The antenna schematic 560 may comprise a graphical representation of one or more antennas installed on an antenna mount. The antenna schematic 560 may comprise a graphical representation of one or more of the antennas installed on the antenna mount selected in the antenna mount menu 420 in FIG. 4 or indicated by a user input.

The antenna schematic 560 may comprise a graphical representation of one or more antennas installed on the antenna mount from different perspectives. For example, the antenna schematic 560*a* comprises a top perspective view of the antennas installed on the antenna mount. The antenna schematic 560*b* comprises a side view of the antennas installed on the antenna mount depicted in the schematic 560*a*. Other perspectives may comprise, for example, bottom perspectives, rotated perspectives, corner perspectives, exploded perspectives, magnified perspectives, and cross section perspectives.

The antenna log 550 may comprise one or more sheets. Each sheet may correspond to antennas installed at a different sector of the antenna mount. The sectors, depicted in antenna schematic 560*a*, may comprise sides or structures of an antenna mount frame. A user may alternate between views of sheets. For example, the user device may obscure or collapse a sheet when another sheet is selected.

The input boxes of the antenna log may enable a user to enter information corresponding to the labels. A user may input information using a keyboard of the user device 100, for example. The input boxes may comprise drop down menus. The drop down menus may comprise options that may be selected to fill one or more input boxes.

Receiving the mapping report, as described in step 210 of FIG. 2 may comprise receiving the information via the GUIs 400 and 500. Alternatively the user device 100 may download, receive, or access the information from another device or a database. The user device 100 may save the information received via the GUIs 400 and 500. The user device 100 may compile the information as a file and save the file.

After receiving the information in GUI 400 and 500, the user device 100 may compute a load bearing capacity of the antenna mount. The load bearing capacity may comprise a maximum wind load, ice load, or dead load capacity of the antenna mount. The user device 100 may generate the load bearing capacity based on the mapping report. The user device 100 may use the attributes of the mapping report to generate the load bearing capacity. Computing the load bearing capacity may comprise using an algorithm or a function. The attributes may be entered in the algorithm or function and the load bearing capacity may be computed.

The user device 100 may compute a geometry of the antenna mount. The user device 100 may compute a geometry of the antenna mount based on the mapping report. The user device 100 may generate the geometry based on geometries of components of the antenna mount provided in the mapping report. The geometry may comprise a relative location of a tower component. The tower component may comprise at least one of an antenna, a tower dish, tower equipment, and a tower support. The geometry may be generated based at least on the load bearing capacity of the tower and the antenna mount. The geometry may be generated based at least on a weight of a tower component, the tower, or the antenna mount.

Figure 6:
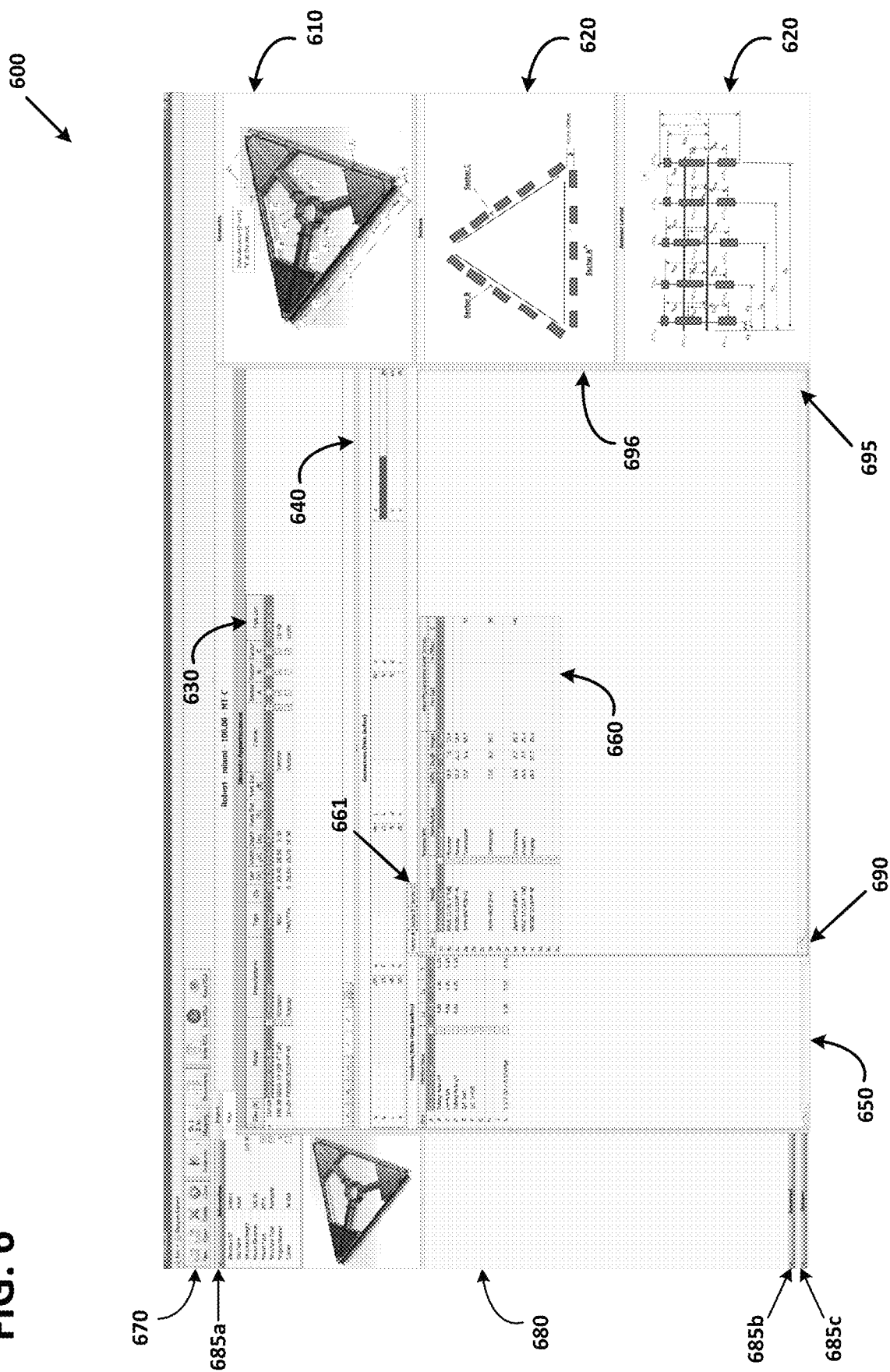
FIG. 6 shows an example graphical user interface for analyzing and designing a base transceiver station tower and a base transceiver station tower antenna mount.

FIG. 6 shows an exemplary GUI 600. The user device 100 may display the GUI 600 after receiving the mapping report. The user device 100 may display the GUI 600 after displaying the GUIs 400 and 500. The GUI 600 may comprise the attributes from the mapping report. The GUI 600 may comprise the computed geometry and the computed load bearing capacity. The GUI 600 may comprise the result of a structural analysis performed with a modeling program, such as in step 270 of FIG. 2. The GUI 600 may comprise a plurality of regions. Each of the plurality of regions may comprise attributes associated with a component of the tower or the antenna mount.

The GUI 600 may comprise a graphical representation 610 of the antenna mount. The user device 100 may generate the graphical representation 610. The graphical representation 610 may be generated based on one or more of the mapping report, the computed geometry and load bearing capacity, or the result of the modeling program. The graphical representation 610 may comprise the antenna mount schematic 540 in FIG. 5. The graphical representation 610 may comprise one or more of the antenna mount geometries, the antenna mount members, and the antenna mount sectors. The graphical representation 610 may comprise a reference or key for attributes in other regions of the GUI 600. The attributes may be labeled or identified in the graphical representation 610.

Figure 7:
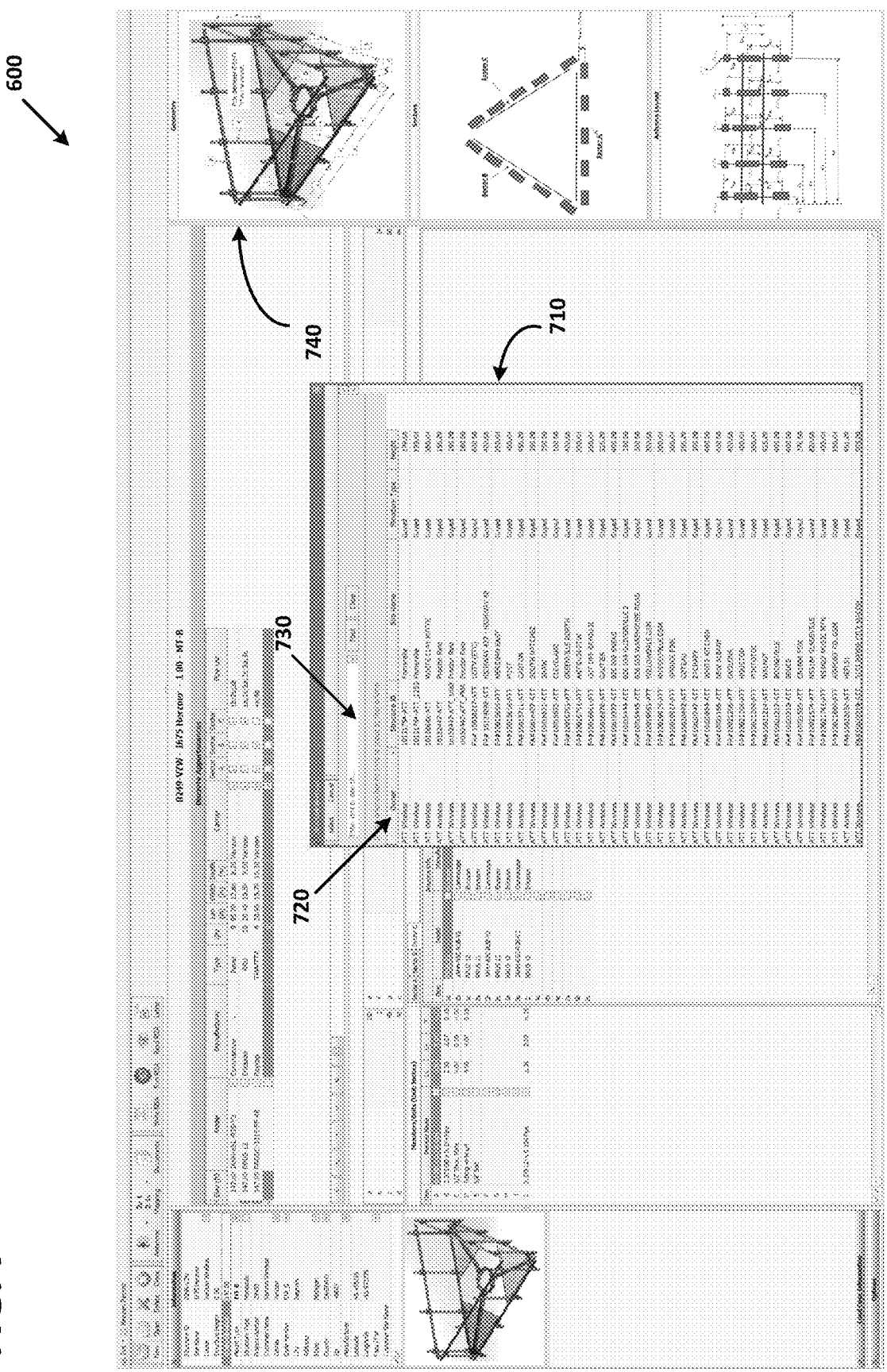
FIG. 7 shows an example graphical user interface for analyzing and designing a base transceiver station tower and a base transceiver station tower antenna mount.

As depicted in FIG. 7, the GUI 600 may comprise a graphical representation 740 of the antenna mount. The user device 100 may generate the graphical representation based at least on the geometry of the antenna mount. The geometry may comprise relative locations of tower components, such as antennas, supports, and tower equipment. The graphical representation 740 may comprise the tower components in the relative locations. The relative locations may comprise locations relative to the tower, the antenna mount, or another tower component. For example, the relative locations may comprise locations on joints or pipes of the antenna mount.

The GUI 600 may comprise an antenna schematic 620, as identified in FIG. 6. The antenna schematic 620 may be like the antenna schematic 560 in FIG. 5. The antenna schematic 620 may comprise a reference or key for antenna attributes in other regions of the GUI 600. The attributes may be labeled or identified in the antenna schematic 620. The antenna schematic 620 may comprise a plurality of perspectives of one or more antennas installed on the antenna mount.

The GUI 600 may comprise a discrete appurtenances table 630. The discrete appurtenances table 630 may comprise proposed loading of the tower and the antenna mount. The proposed loading may comprise tower equipment or a tower attachment, such as an antenna, a mount, a dish, or an attachment set. The user device 100 may determine the proposed loading based on the mapping report or the computed geometry and load bearing capacity.

The discrete appurtenances table 630 may comprise a plurality of columns and rows. The rows and columns may comprise attributes of proposed loading. The attributes may comprise, for example, a model, a manufacturer, a type, a quantity, a dimension, and a carrier of the proposed loading. The attributes may comprise a sector of the antenna mount that the proposed loading may be coupled to or installed on. The attributes may comprise a pipe location of the antenna mount to which the proposed loading may be coupled or installed.

The discrete appurtenances table 630 may comprise one or more input boxes. The one or more input boxes may enable a user to input a proposed loading or an attribute. The user may input the proposed loading or an attribute by entering text in the box, such as by using a keyboard of the user device 100. The user may input the proposed loading or an attribute by checking or unchecking a check box.

Figure 8:
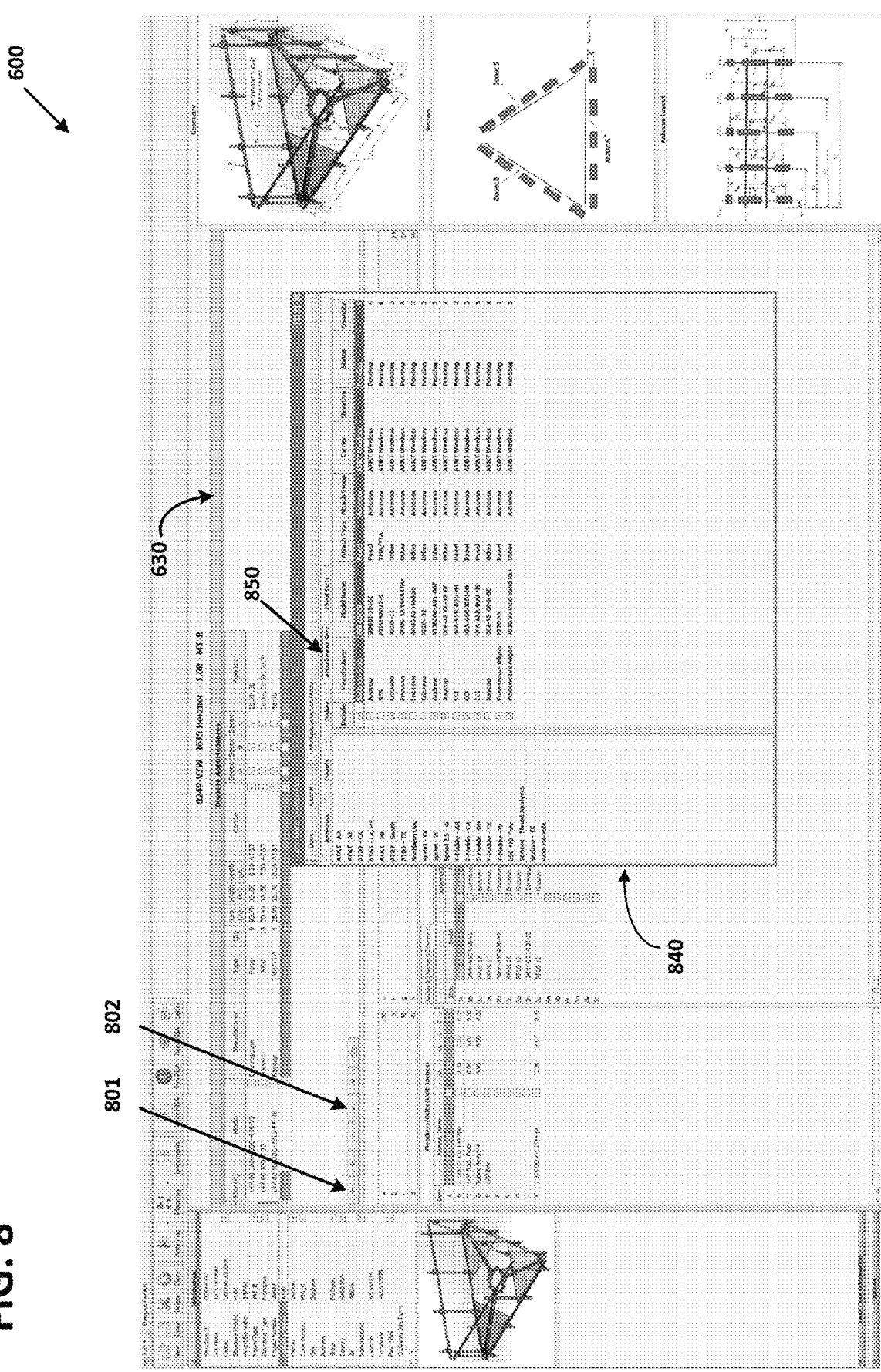
FIG. 8 shows an example graphical user interface for analyzing and designing a base transceiver station tower and a base transceiver station tower antenna mount.

As identified in FIG. 8, the discrete appurtenance table 630 may comprise a selectable icon 802 to delete a row of the table 30. The discrete appurtenances table 630 may comprise a selectable icon 801 to add a row to the table or to add a discrete appurtenance to the analysis model. In response to a selection of the selectable icon 801, the user device 100 may display a menu of discrete appurtenances 840. FIG. 8 depicts the discrete appurtenance selection form 840 as a pop-up window. However the discrete appurtenance selection form 840 may comprise a drop-down menu or another type of menu.

The discrete appurtenance selection form 840 may comprise sheets associated with types of discrete appurtenances, such as antennas, mounts, dishes, and attachment sets. The sheets may comprise selectable tabs 850. In response to a selection of a tab 850, the user device 100 may display the sheet associated with the tab 850. In response to a selection of a tab 850, the user device may collapse or hide sheets not associated with the tab 850. A sheet may comprise a list of discrete appurtenances or attributes of discrete appurtenances of the type associated with the sheet. The user device 100 may populate the discrete appurtenance selection form 840 with data from the memory 105 or an external database.

Figure 9:
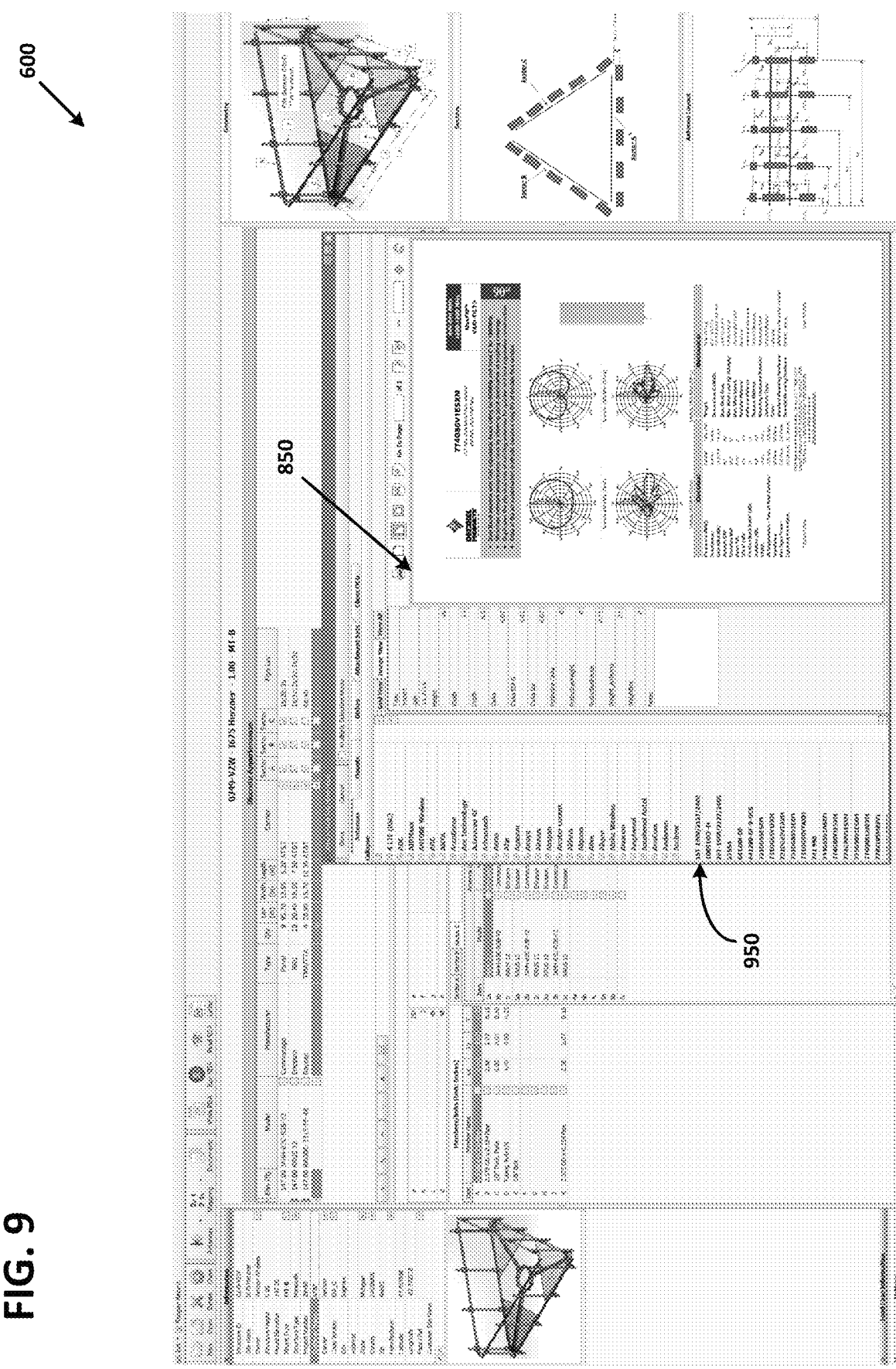
FIG. 9 shows an example graphical user interface for analyzing and designing a base transceiver station tower and a base transceiver station tower antenna mount.

FIG. 9 depicts the discrete appurtenance selection form 840 as comprising specifications 950 of the discrete appurtenances. A specification 950 may comprise a publication of the manufacturer of the discrete appurtenance. The specification 950 may comprise images of the discrete appurtenance. The specification 950 may comprise attributes of the discrete appurtenance.

In response to a selection of a discrete appurtenance from the discrete appurtenance selection form 840, the user device 100 may display a new row in the discrete appurtenances table 630. The new row may comprise attributes of the selected discrete appurtenance. The user device 100 may generate the geometry or the load bearing capacity for the tower and the selected discrete appurtenance. The user device 100 may display the computed geometry and the load bearing capacity in the GUI 600.

Referring to features identified in FIG. 6, the GUI 600 may comprise a geometries table 640. The geometries table 640 may comprise identifiers of geometries of the antenna mount. The geometries table 640 may comprise attributes of the geometries, such as dimensions. The geometries table 640 may comprise a plurality of columns and rows. The user device 100 may fill the plurality of columns and rows with the attributes from the mapping report.

The GUI 600 may comprise an antenna mount members table 650. The antenna mount members table 650 may comprise identifiers of the antenna mount members, such as names or reference numbers or letters. The antenna mount members table 650 may comprise attributes of the members, such as dimensions. The antenna mount members table may comprise a plurality of columns and rows. The user device 100 may fill the plurality of columns and rows with the attributes from the mapping report.

The GUI 600 may comprise an antenna table 660. The antenna table 660 may comprise identifiers of antennas, such as reference letters or numbers. The antenna mount sector table 660 may comprise attributes of the antennas. The attributes may comprise antenna models, manufacturers, and dimensions. The attributes may comprise locations on the antenna mount at which the antenna should be coupled or installed. The antenna table 660 may be grouped by antennas configured to be coupled to antenna mount sectors. The antenna table 660 may comprise a sheet for each antenna mount sector. The sheets may comprise tabs 661. The user device 100 may display a sheet in response to a user selecting a tab 661 associated with the sheet. The user device 100 may hide or collapse a sheet in response to a user selecting a tab 661 associated with another sheet. The antenna table may comprise a plurality of columns and rows. The user device 100 may fill the plurality of columns and rows with the attributes from the mapping report.

The GUI 600 may comprise a selection bar 670. The selection bar 670 may comprise selectable icons. The selection bar 670 may comprise selectable text. The icons or text may comprise, for example, "New", "Open", "Delete", "Close", "Antennas", "Mapping", "Documents", "Write RISA", "Run RISA", and "Read RISA" options. The user device 100 may emphasize any of the icons in response to a user selection of the icon or a placement of a cursor over the icon. Emphasizing the icon may comprise darkening the icon, changing the color of the icon, or illuminating the icon. Emphasizing the icon may comprise resizing the icon, such as enlarging the icon.

In response to a selection of the "New" option, the user device 100 may opening a new mapping form, such as the GUI 400 in FIG. 4 or the GUI 500 in FIG. 5. In response to a selection of "Open", the user device 100 may retrieve a saved analysis model, wherein the analysis model may comprise attributes of a tower and antenna mount installed with an antenna or tower equipment. The stored model may comprise a computed geometry and load bearing capacity. The stored model may comprise a result from the modeling program. A menu of saved analysis models may be displayed. FIG. 7 shows a menu 710 of saved analysis models. The menu 710 is depicted as a pop-up window. The menu 710 may comprise a directory or database of saved analysis models. The menu 710 may comprise columns and column headers 720. The column headers 720 may comprise labels comprising fields by which the saved analysis models may be organized and displayed, such as identifiers of a tower or a tower owner. The column headers 720 may be dragged or re-positioned to re-organize the displayed saved analysis models. The menu 710 may comprise a search box 730. The search box 730 may enable a user to enter text that may be used to search for a saved analysis model.

In response to a selection of the "Delete" option, the user device 100 may clear one or more tables, regions, or boxes. The user device 100 may delete temporarily stored information such as attributes received from a user. In response to the "Close" option, the user device 100 may terminate the executable application. The user device 100 may close the GUI 600.

In response to a selection of the "Antennas" option, the user device 100 may display a plurality of antennas. The user device 100 may retrieve the plurality of antennas from the memory 105 of the user device 100. The user device 100 may retrieve or download the plurality of antennas from an external memory or another device. Each of the plurality of antennas may be selectable. In response to a selection of an antenna, the user device 100 may update one or more of the attributes displayed on GUI 600. In response to the selection of the antenna, the user device 100 may re-generate the geometry and the load bearing capacity.

In response to a selection of the "Mapping" option, a drop-down menu may be displayed comprising an "Import" option and a "View" option. In response to a selection of the "Import" open, a menu or directory of saved mapping reports may be displayed. The menu or directory may comprise folders or locations of the user device 100 where mapping reports may be saved. In response to a selection of a mapping report, the user device 100 may compute a geometry and a load bearing capacity based on the mapping report. In response to a selection of "View" option, the user device 100 may display a mapping report, such as a received mapping report.

In response to a selection of the "Documents" option, the user device 100 may display a folder of projects of a user. The projects may comprise analysis models associated with a tower of the user. The projects may comprise records of a user associated with a tower.

The "Write RISA" option may be associated with writing an input file for a modeling program. Although the name refers to the RISA software, the GUI 600 and the bar 670 may comprise an icon associated with writing an input file for any modeling program. In response to a selection of the "Write RISA" option, the user device 100 may generate an input file for a modeling program, like in step 250 of FIG. 2. The modeling program may comprise software, such as RISA by RISA Technologies, Inc., STAAD.Pro by Bentley Systems, Inc., SAP2000 v18 by Computers and Structures, Inc., or Etabs 2013 by Computers and Structures, Inc. The modeling program may comprise a program that performs a simulation of the tower and the antenna mount installed with one or more antenna and tower equipment. The modeling program may perform a stress and strain analysis for the tower and the antenna mount installed with one or more antenna and tower equipment. The modeling program may perform a simulation or analysis using the computed antenna mount geometry and load bearing capacity.

The input file may comprise a text file. The input file may comprise script file. The input file may comprise a format specific to the modeling program. For example, an input file for RISA may comprise a .r3d file. An input file for the STAAD may comprise a .std file. The input file may comprise attributes from the mapping report. The input file may comprise the computed geometry and load bearing capacity. The user device 100 may store the generated input file temporarily or for future use. The user device 100 may store the generated input file on the memory 103.

In response to a selection of the "Run RISA" option, the user device 100 may run the modeling program using the input file, like in step 270 of FIG. 2. The user device 100 may import the input file to the modeling program. The processor 101 of the user device may execute the modeling program. The modeling program may produce a result. The result may comprise a stress and strain distribution of the tower and the antenna mount installed with at least one of the antenna and the tower equipment. The result may comprise a stress and strain curve of the tower and the antenna mount installed with at least one of the antenna and the tower equipment. The user device 100 may save the result of the modeling program.

The user device 100 may display a result from the modeling program, like in step 280 of FIG. 2. The user device 100 may display the result textually and/or graphically using the output 103 of the user device. The user device 100 may render the result via the GUI 600. The user device 100 may fill data fields with the result and display the data fields via the GUI 600. The user may use the result to determine whether the analyzed tower and antenna mount installed with one or more antenna and tower equipment is structurally sound. The user may use the result to determine whether the analyzed tower and antenna mount installed with one or more antenna and tower equipment meets a regulatory requirement. The user device 100 may receive an indication of the user's assessment of the analyzed tower and antenna mount installed with one or more antenna and tower equipment. For example, the user may select a "fail" icon or a "pass" icon on the GUI.

In response to a selection of "Read RISA", the user device 100 may load and display an input file generated by the user device 100. A user may view an input file to debug the input file. A user may view an input file before requesting the user device 100 to run the input file.

The GUI 600 may comprise a side panel 680. The side panel may comprise one or more collapsible sections 685. In response to a selection of a collapsible section 685, the user device 100 may collapse the other collapsible sections 685. Collapsing may comprise closing or concealing information in the section 685. Collapsing may comprise minimizing the section 685. The selected collapsible section 685 may be expanded. For example, FIG. 56 depicts collapsible section 685*a* as expanded and collapsible sections 685*b* and 685*c* as collapsed. The collapsible sections 685 may comprise attributes from the mapping report. At least one of the collapsible sections 685 may comprise information from the information bar 420 of the mapping form in FIG. 4. The side panel 680 may comprise information identifying the user or the tower.

One or more of the regions of the GUI 600, such as the tables 630, 640, 650, 660, side panel 680, may comprise one or more buttons 690 to minimize or maximize the region. The one or more regions may comprise a scroll bar 695. The scroll bar 695 may enable a user to pan left, right, up, or down on the region. The one or more regions may comprise buttons 690 to save or confirm the contents of the table. The one or more regions may comprise resizable borders 696. The resizable borders 696 may be selected or dragged to resize, reposition, open, or close a region.

The GUI 600 may comprise a modification panel. For example, one of the collapsible sections 685 of the left panel 680 may comprise the modification panel Based on the result of the modeling program, a user may determine that the analyzed tower and antenna mount installed with one or more antenna and tower equipment is not structurally sound or does not meet a regulatory requirement. In the modification panel, the user may input an indication that the analyzed tower and antenna mount installed with one or more antenna and tower equipment is not structurally sound. The user may input a rating in the modification panel. The modification panel may comprise one or more selectable icons associated with a rating, such as a "fail" icon or a "pass" icon. The modification panel may comprise a selectable option for requesting a modification analysis.

In response to receiving a selection or request for the modification analysis in the modification panel, the user device 100 may perform a modification analysis. The modification analysis may comprise determining an alternate design, such as an alternate antenna or tower equipment to install on the tower and the antenna mount. The user device 100 may determine a modification element. The modification element may comprise an alternate antenna or alternate tower equipment. The modification element may comprise a support element or a reinforcement element. Determining the modification element may comprise accessing or querying a database. The database may comprise a database of tower or antenna mount components. The database may comprise a database of antennas.

The user device 100 may determine the modification element based on the result of the modeling analysis. The user device 100 may determine the modification element based on a computed load bearing capacity or geometry of the antenna mount. The user device 100 may determine the modification element based on a user input in the modification panel. The user input may comprise a selection or an indication of a tower component to be modified in the modification panel. The user input may comprise a selection of the modification element, such as in a menu of alternate tower components of the modification panel.

The user device 100 may receive a selection of the modification element. The user device 100 may receive the selection via the GUI, such as by receiving a selection of an option on a menu of modification elements rendered by the GUI.

The user device 100 may display the modification element via the GUI 600. The user device 100 may generate a graphical representation of the tower and the antenna mount coupled to the modification element. The user device 100 may display the graphical representation via the GUI 600. The user device 100 may generate an input file for the modeling program comprising the modification element. The user device 100 may run the modeling program using the input file. The modeling program may produce a result, such as a stress and strain analysis of the tower and the antenna mount installed with the modification element. The user device 100 may display the result of the modeling program via the GUI 600.

The user device 100 may store the result of the modification analysis. The result of the modification analysis may be stored at the computing device 120, the memory 135 of the user device 100, or the user database 140. The user device 100 may transmit the result of the modification analysis, such as to an account associated with the user or to a regulatory agency.

What is claimed is:

1. A method comprising:
   receiving, by a user interface of a computing device, a selection of a modification element for an existing tower and an antenna mount, wherein the modification element comprises at least one of an antenna, a tower attachment, a tower dish, and an antenna support;
   generating, based on the selection of the antenna mount, a mapping form, wherein the mapping form comprises a graphical representation of the antenna mount and a plurality of input boxes corresponding to attributes of the existing tower or the antenna mount;
   retrieving, from a database, a geometry of the existing tower and the antenna mount and a load bearing capacity of the existing tower and the antenna mount, wherein the geometry comprises a relative position of each of a plurality of modification elements and the relative position is based at least on a load bearing capacity of the antenna mount;
   generating an input file for a modeling program, wherein the input file comprises the geometry, the mapping form, and the modification element;

importing the input file to the modeling program and running the modeling program, wherein the modeling program performs a structural analysis of the existing tower, the antenna mount, and the modification element using the input file; and rendering, by the user interface, a result of the structural analysis of the modeling program, wherein the result comprises a stress and strain of the existing tower, the antenna mount, and the modification element.

2. The method of claim 1, wherein the geometry and the load bearing capacity comprise a geometry and a load bearing capacity of the existing tower and the antenna mount generated by the user interface.

3. The method of claim 1, wherein the selection of the modification element comprises clicking or touching an icon or text associated with the modification element via a display of the user interface.

4. A method comprising:

retrieving, by a computing device, a load bearing capacity and a geometry of an existing tower and an antenna mount;

determining a modification element for the existing tower, wherein the modification element comprises an antenna, a tower attachment, a tower dish, or an antenna support, and wherein the geometry comprises a relative position of each of a plurality of modification elements and the relative position is based at least on a load bearing capacity of the antenna mount;

generating, based on the selection of the antenna mount, a mapping form, wherein the mapping form comprises a graphical representation of the antenna mount and a plurality of input boxes corresponding to attributes of the existing tower or the antenna mount;

generating an input file for a modeling program, the input file comprising the geometry, the mapping form, and the modification element;

importing the input file to the modeling program and running the modeling program, wherein the modeling program performs a structural analysis of the existing tower, the antenna mount, and the modification element using the input file; and displaying, via a user interface of the computing device, a result of the structural analysis of the modeling program, wherein the result comprises a stress and strain of the existing tower, the antenna mount, and the modification element.

5. The method of claim 4, wherein the retrieving the load bearing capacity and the geometry comprises:

receiving, by a user interface of the computing device, a request for a past analysis model of the existing tower, the request comprising an identification of the past analysis model;

querying, using an identifier of the existing tower, a database;

retrieving, from the database, a plurality of files associated with the existing tower; and determining, using the identification of the past analysis model, one of the plurality of files comprising the past analysis model.

6. The method of claim 5, wherein the method further comprises:

extracting the load bearing capacity, the geometry, and attributes of the existing tower and the antenna mount from the one of the plurality of files;

populating a plurality of fields based at least on the load bearing capacity, the geometry, and the attributes; and rendering, via the user interface, the plurality of fields.

7. The method of claim 4, wherein the determining the modification element for the existing tower comprises receiving, by a user interface of the computing device, a request to modify a component of the existing tower.

8. The method of claim 4, further comprising receiving, by a user interface of the computing device, a rating of structural integrity of the existing tower; and wherein the determining the modification element for the existing tower is further based on the rating.

9. The method of claim 4, wherein the determining the modification element for the existing tower is based on a result of a structural analysis of the existing tower.

* * * * *